United States Patent
Shahsavari et al.

(10) Patent No.: US 10,797,534 B2
(45) Date of Patent: Oct. 6, 2020

(54) FOREIGN OBJECT DETECTION IN WIRELESS CHARGING SYSTEMS WITH MULTIPLE POWER RECEIVING DEVICES PRESENT ON A POWER TRANSMITTING DEVICE

(71) Applicant: Apple Inc., Cupertino, CA (US)

(72) Inventors: Behrooz Shahsavari, Hayward, CA (US); Weiyu Huang, Santa Clara, CA (US); Sneha Kadetotad, Cupertino, CA (US); Baboo V. Gowreesunker, San Francisco, CA (US); Jacob Mattingley, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 479 days.

(21) Appl. No.: 15/875,127

(22) Filed: Jan. 19, 2018

(65) Prior Publication Data

US 2019/0081516 A1 Mar. 14, 2019

Related U.S. Application Data

(60) Provisional application No. 62/556,963, filed on Sep. 11, 2017.

(51) Int. Cl.
*H02J 50/60* (2016.01)
*H02J 50/12* (2016.01)
(Continued)

(52) U.S. Cl.
CPC .......... *H02J 50/60* (2016.02); *G01R 27/2611* (2013.01); *G01R 27/2688* (2013.01);
(Continued)

(58) Field of Classification Search
CPC .. H02J 50/60; H02J 50/12; H02J 50/40; H02J 50/90; H02J 7/025; H02J 7/0042; G01R 27/2688; G01R 27/2611; H01F 38/14
See application file for complete search history.

(56) References Cited

U.S. PATENT DOCUMENTS

| | | | |
|---|---|---|---|
| 2015/0123602 A1* | 5/2015 | Patino | H02J 7/025 320/108 |
| 2016/0064950 A1 | 3/2016 | Tseng | |

(Continued)

OTHER PUBLICATIONS

Liu et al., "A Simple Structure of Planar Transmitting Array for Multi-Receiver Wireless Power Reception", Wireless Power Transfer Conference (WPTC), 2017 IEEE.

*Primary Examiner* — Richard Isla
*Assistant Examiner* — Sailesh Thapa
(74) *Attorney, Agent, or Firm* — Treyz Law Group, P.C.; Joseph F. Guihan (57) ABSTRACT

A wireless power transmission system has a wireless power receiving device that is located on a charging surface of a wireless power transmitting device. The wireless power receiving device has a wireless power receiving coil and the wireless power transmitting device has a wireless power transmitting coil array. Signal measurement circuitry coupled to the coil array may make measurements while the control circuitry uses the inverter circuitry to apply excitation signals to each of the coils. Foreign objects on the coil array such as metallic objects without wireless power receiving coils can be detected using foreign object detection. When multiple wireless power receiving devices are present on the wireless power transmitting device, steps may be taken to isolate measurements from the coils associated with each wireless power receiving device. Foreign object detection may then be performed on these modified measurements.

20 Claims, 6 Drawing Sheets

(51) Int. Cl.
    *G01R 27/26*    (2006.01)
    *H02J 50/40*    (2016.01)
    *H02J 7/02*     (2016.01)
    *H01F 38/14*    (2006.01)
    *H02J 50/90*    (2016.01)

(52) U.S. Cl.
    CPC .............. H02J 50/12 (2016.02); H02J 50/40 (2016.02); *H01F 38/14* (2013.01); *H02J 7/025* (2013.01); *H02J 50/90* (2016.02)

(56) References Cited

U.S. PATENT DOCUMENTS

| | | | |
|---|---|---|---|
| 2016/0226292 A1 | 8/2016 | Yoon | |
| 2017/0155280 A1* | 6/2017 | Okamoto | H02J 7/025 |
| 2017/0237296 A1 | 8/2017 | Keith et al. | |
| 2017/0317536 A1 | 11/2017 | Marson et al. | |
| 2017/0338684 A1 | 11/2017 | Mishriki et al. | |
| 2019/0068001 A1* | 2/2019 | Lovas | H02J 50/10 |
| 2019/0319494 A1* | 10/2019 | Park | H02J 7/02 |

\* cited by examiner

FOREIGN OBJECT DETECTION IN WIRELESS CHARGING SYSTEMS WITH MULTIPLE POWER RECEIVING DEVICES PRESENT ON A POWER TRANSMITTING DEVICE

This application claims the benefit of provisional patent application No. 62/556,963, filed on Sep. 11, 2017, which is hereby incorporated by reference herein in its entirety.

FIELD

This relates generally to power systems, and, more particularly, to wireless power systems for charging devices.

BACKGROUND

In a wireless charging system, a wireless charging mat wirelessly transmits power to an electronic device that is placed on the mat. The electronic device has a receiving coil and rectifier circuitry for receiving wireless alternating-current (AC) power from a coil in the wireless charging mat that is in the proximity of the receiving coil. The rectifier converts the received AC power into direct-current (DC) power. When there is a foreign object on the mat, the mat control circuitry may take suitable actions to prevent undesirable heating.

SUMMARY

A wireless power transmission system has a wireless power receiving device that is located on a charging surface of a wireless power transmitting device. The wireless power receiving device has a wireless power receiving coil and the wireless power transmitting device has a wireless power transmitting coil array. Control circuitry may use inverter circuitry in the wireless power transmitting device to supply alternating-current signals to coils in the coil array, thereby transmitting wireless power signals.

Signal measurement circuitry coupled to the coil array may make measurements while the control circuitry uses the inverter circuitry to apply excitation signals to each of the coils. The control circuitry can analyze measurements made with the signal measurement circuitry to determine the values of inductances and other measurements associated with the coils in the coil array.

Foreign objects on the coil array such as metallic objects without wireless power receiving coils can be detected using foreign object detection. When multiple wireless power receiving devices are present on the wireless power transmitting device, steps may be taken to isolate measurements from the coils associated with each wireless power receiving device. Foreign object detection may then be performed on these modified measurements.

DETAILED DESCRIPTION

A wireless power system may have a wireless power transmitting device such as wireless charging mat. The wireless power transmitting device may wirelessly transmit power to one or more wireless power receiving devices such as a wristwatch, cellular telephone, tablet computer, laptop computer, electric vehicle, or other electronic device. The wireless power receiving device(s) may use power from the wireless power transmitting device for powering the device and for charging an internal battery.

Figure 1:
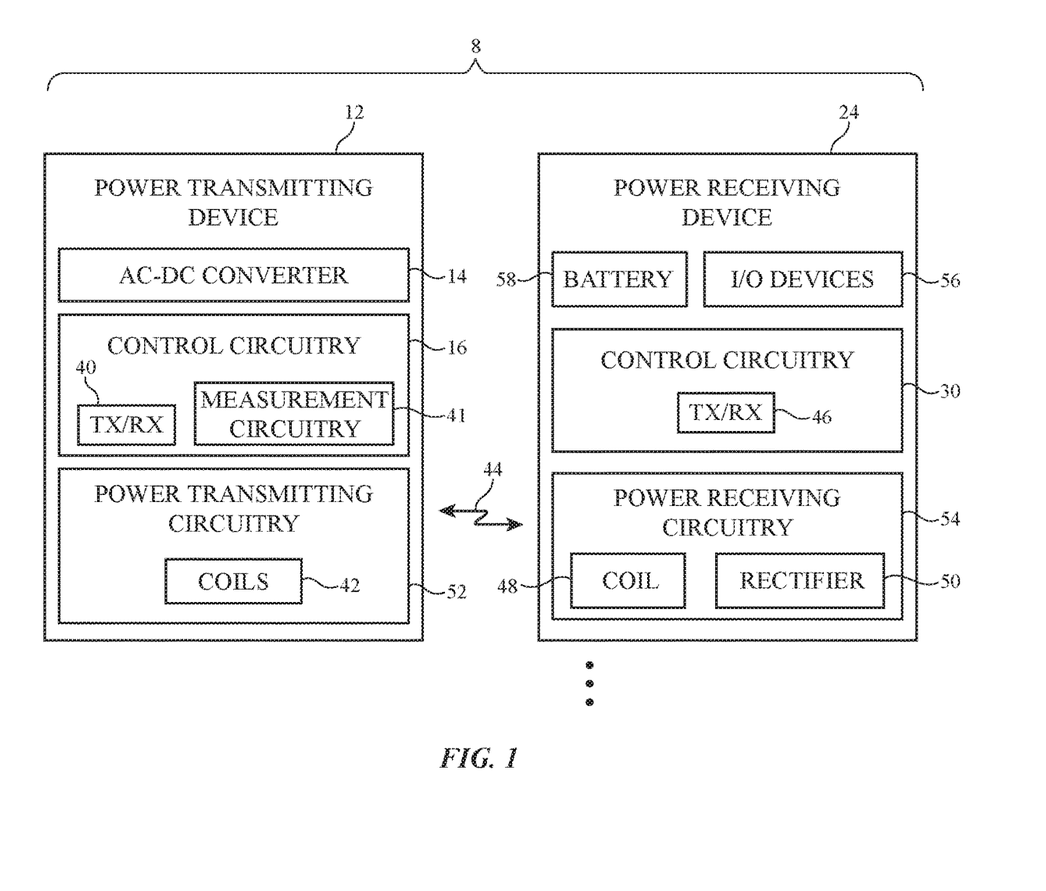
FIG. 1 is a schematic diagram of an illustrative wireless charging system that includes a wireless power transmitting device and a wireless power receiving device in accordance with an embodiment.

An illustrative wireless power system (wireless charging system) is shown in FIG. 1. As shown in FIG. 1, wireless power system 8 may include a wireless power transmitting device such as wireless power transmitting device 12 and may include a wireless power receiving device such as wireless power receiving device 24. Wireless power transmitting device 12 may include control circuitry 16. Wireless power receiving device 24 may include control circuitry 30. Control circuitry in system 8 such as control circuitry 16 and control circuitry 30 may be used in controlling the operation of system 8. This control circuitry may include processing circuitry associated with microprocessors, power management units, baseband processors, digital signal processors, microcontrollers, and/or application-specific integrated circuits with processing circuits. This processing circuitry implements desired control and communications features in devices 12 and 24. For example, the processing circuitry may be used in determining power transmission levels, processing sensor data, processing user input, handling negotiations between devices 12 and 24, sending and receiving in-band and out-of-band data packets, and processing other information and using this information to adjust the operation of system 8.

Control circuitry in system 8 may be configured to perform operations in system 8 using hardware (e.g., dedicated hardware or circuitry), firmware and/or software. Software code for performing operations in system 8 is stored on non-transitory computer readable storage media (e.g., tangible computer readable storage media) in control circuitry 8. The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, or the like. Software stored on the non-transitory computer readable storage media may be executed on the processing circuitry of control circuitry 16 and/or 30. The processing circuitry may include application-specific integrated circuits with processing circuitry, one or more microprocessors, a central processing unit (CPU) or other processing circuitry.

Power transmitting device 12 may be a stand-alone power adapter (e.g., a wireless charging mat that includes power adapter circuitry), may be a wireless charging mat that is coupled to a power adapter or other equipment by a cable, may be a portable device, may be equipment that has been incorporated into furniture, a vehicle, or other system, or may be other wireless power transfer equipment. Illustrative configurations in which wireless power transmitting device 12 is a wireless charging mat may sometimes be described herein as an example.

Power receiving device 24 may be a portable electronic device such as a wristwatch, a cellular telephone, a laptop computer, a tablet computer, or other equipment. Power transmitting device 12 may be coupled to a wall outlet (e.g., alternating current), may have a battery for supplying power, and/or may have another source of power. Power transmitting device 12 may have an AC-DC power converter such as power converter 14 for converting AC power from a wall outlet or other power source into DC power. DC power may be used to power control circuitry 16. During operation, a controller in control circuitry 16 may use power transmitting circuitry 52 to transmit wireless power to power receiving circuitry 54 of device 24. Power transmitting circuitry 52 may have switching circuitry (e.g., an inverter formed from transistors) that is turned on and off based on control signals provided by control circuitry 16 to create AC current signals through one or more coils 42. Coils 42 may be arranged in a planar coil array (e.g., in configurations in which device 12 is a wireless charging mat).

As the AC currents pass through one or more coils 42, alternating-current electromagnetic fields (signals 44) are produced that are received by one or more corresponding coils such as coil 48 in power receiving device 24. When the alternating-current electromagnetic fields are received by coil 48, corresponding alternating-current currents are induced in coil 48. Rectifier circuitry such as rectifier 50, which contains rectifying components such as synchronous rectification metal-oxide-semiconductor transistors arranged in a bridge network, converts received AC signals (received alternating-current signals associated with electromagnetic signals 44) from coil 48 into DC voltage signals for powering device 24.

The DC voltages produced by rectifier 50 can be used in powering a battery such as battery 58 and can be used in powering other components in device 24. For example, device 24 may include input-output devices 56 such as a display, touch sensor, communications circuits, audio components, sensors, and other components and these components may be powered by the DC voltages produced by rectifier 50 (and/or DC voltages produced by battery 58).

Device 12 and/or device 24 may communicate wirelessly using in-band or out-of-band communications. Device 12 may, for example, have wireless transceiver circuitry 40 that wirelessly transmits out-of-band signals to device 24 using an antenna. Wireless transceiver circuitry 40 may be used to wirelessly receive out-of-band signals from device 24 using the antenna. Device 24 may have wireless transceiver circuitry 46 that transmits out-of-band signals to device 12. Receiver circuitry in wireless transceiver 46 may use an antenna to receive out-of-band signals from device 12.

Wireless transceiver circuitry 40 uses one or more coils 42 to transmit in-band signals to wireless transceiver circuitry 46 that are received by wireless transceiver circuitry 46 using coil 48. Any suitable modulation scheme may be used to support in-band communications between device 12 and device 24. With one illustrative configuration, frequency-shift keying (FSK) is used to convey in-band data from device 12 to device 24 and amplitude-shift keying (ASK) is used to convey in-band data from device 24 to device 12. Power is conveyed wirelessly from device 12 to device 24 during these FSK and ASK transmissions.

During wireless power transmission operations, circuitry 52 supplies AC drive signals to one or more coils 42 at a given power transmission frequency. The power transmission frequency may be, for example, a predetermined frequency of about 125 kHz, at least 80 kHz, at least 100 kHz, less than 500 kHz, less than 300 kHz, or other suitable wireless power frequency. In some configurations, the power transmission frequency may be negotiated in communications between devices 12 and 24. In other configurations, the power transmission frequency is fixed.

During wireless power transfer operations, while power transmitting circuitry 52 is driving AC signals into one or more of coils 42 to produce signals 44 at the power transmission frequency, wireless transceiver circuitry 40 uses FSK modulation to modulate the power transmission frequency of the driving AC signals and thereby modulate the frequency of signals 44. In device 24, coil 48 is used to receive signals 44. Power receiving circuitry 54 uses the received signals on coil 48 and rectifier 50 to produce DC power. At the same time, wireless transceiver circuitry 46 uses FSK demodulation to extract the transmitted in-band data from signals 44. This approach allows FSK data (e.g., FSK data packets) to be transmitted in-band from device 12 to device 24 with coils 42 and 48 while power is simultaneously being wirelessly conveyed from device 12 to device 24 using coils 42 and 48.

In-band communications between device 24 and device 12 use ASK modulation and demodulation techniques. Wireless transceiver circuitry 46 transmits in-band data to device 12 by using a switch (e.g., one or more transistors in transceiver 46 that are coupled coil 48) to modulate the impedance of power receiving circuitry 54 (e.g., coil 48). This, in turn, modulates the amplitude of signal 44 and the amplitude of the AC signal passing through coil(s) 42. Wireless transceiver circuitry 40 monitors the amplitude of the AC signal passing through coil(s) 42 and, using ASK demodulation, extracts the transmitted in-band data from these signals that was transmitted by wireless transceiver circuitry 46. The use of ASK communications allows ASK data bits (e.g., ASK data packets) to be transmitted in-band from device 24 to device 12 with coils 48 and 42 while power is simultaneously being wirelessly conveyed from device 12 to device 24 using coils 42 and 48.

Control circuitry 16 has external object measurement circuitry 41 (sometimes referred to as foreign object detection circuitry or external object detection circuitry) that detects external objects on a charging surface associated with device 12. Circuitry 41 can detect wireless power receiving devices 24 with at least one wireless power receiving coil that are capable of communicating with and/or receiving power from power transmitting device 12. Wireless power receiving devices with at least one wireless power receiving coil that are capable of communicating with and/or receiving power from power transmitting device 12 may sometimes be referred to as supported devices or compatible devices. Circuitry 41 may also detect unsupported or incompatible electronic devices (i.e., electronic devices that are not operable to wirelessly receive power from power transmitting device 12) and objects such as coins, keys, paper clips, and other metallic objects that may potentially be undesirably heated. For simplicity, incompatible electronic devices and other metallic objects such as coins, keys, and paper clips may all be referred to as foreign objects.

In an illustrative arrangement, measurement circuitry 41 of control circuitry 16 contains signal generator circuitry (e.g., oscillator circuitry for generating AC probe signals at one or more probe frequencies, a pulse generator, etc.) and signal detection circuitry (e.g., filters, analog-to-digital converters, impulse response measurement circuits, etc.). During measurement operations, switching circuitry in device 12 may be adjusted by control circuitry 16 to switch each of coils 42 into use. As each coil 42 is selectively switched into use, control circuitry 16 uses the signal generator circuitry of signal measurement circuitry 41 to apply an excitation signal (sometimes referred to as an impulse signal or probe signal) to that coil while using the signal detection circuitry of signal measurement circuitry 41 to measure a corresponding response. Measurement circuitry in control circuitry 30 and/or in control circuitry 16 may also be used in making current and voltage measurements.

The characteristics of each coil 42 depend on whether any objects overlap that coil and also depend on whether a wireless power receiving device with a coil such as coil 48 of FIG. 1 is present, which could change the measured inductance of any overlapped or nearby coil 42. Signal measurement circuitry 41 is configured to measure signals at the coil while supplying the coil with signals at one or more frequencies (to measure coil inductances), signal pulses (e.g., so that measurement circuitry in the measurement circuitry can be used to make inductance and Q factor measurements), etc. Using measurements from measurement circuitry 41, the wireless power transmitting device determines whether an external object is present on the coils. If, for example, all of coils 42 exhibit their expected nominal response to the applied signals, control circuitry 16 can conclude that no external devices are present. If one of coils 42 exhibits a different response (e.g., a response varying from a normal no-objects-present baseline), control circuitry 16 can conclude that an external object (potentially a compatible wireless power receiving device) is present.

Figure 2:
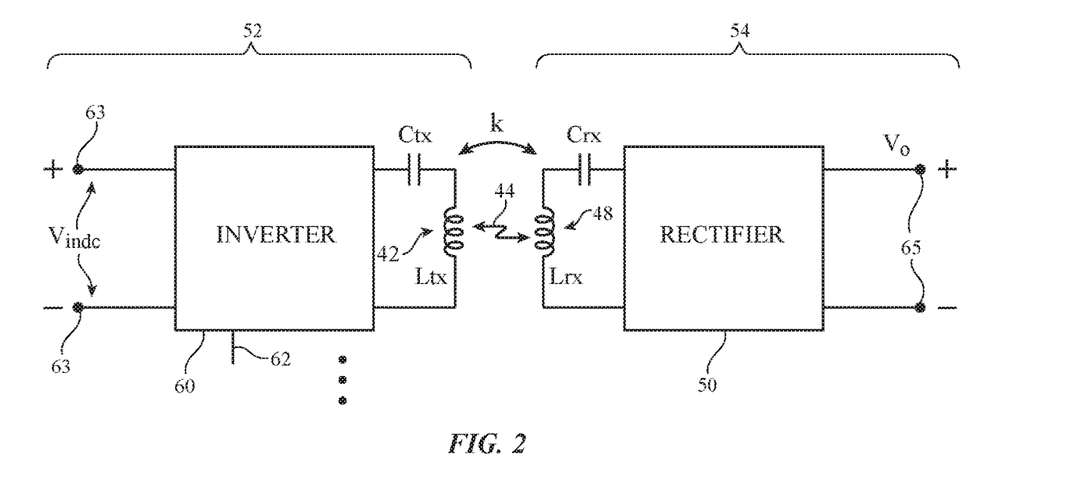
FIG. 2 is a circuit diagram of illustrative wireless power transmitting circuitry and illustrative wireless power receiving circuitry in accordance with an embodiment.

Illustrative circuitry of the type that may be used for forming power transmitting circuitry 52 and power receiving circuitry 54 of FIG. 1 is shown in FIG. 2. As shown in FIG. 2, power transmitting circuitry 52 may include drive circuitry (inverter circuitry) for supplying alternating-current drive signals to coils 42. With one illustrative configuration, the inverter circuitry includes multiple inverter circuits such as inverter 60 of FIG. 2 each of which is controlled by control circuitry 16 of device 12 and each of which is coupled to a respective one of coils 42.

Magnetic coupling coefficient k represents the amount of magnetic coupling between transmitting and receiving coils in system 8. Wireless power transfer efficiency scales with k, so optimum charging (e.g., peak efficiency) may be obtained by evaluating the coupling coefficient k for each coil and choosing appropriate coil(s) to use in transmitting wireless power to device 24 based on the coupling coefficients. After coupling coefficients k have been determined for each coil 42, control circuitry 16 can switch appropriate coil(s) 42 into use by selecting corresponding inverters 60 to use in driving signals into the coils.

Each inverter 60 has metal-oxide-semiconductor transistors or other suitable transistors. These transistors are modulated by an AC control signal from control circuitry 16 (FIG. 1) that is received on control signal input 62. The AC control signal controls modulate the transistors so that direct-current power (input voltage Vindc across direct-current power supply input terminals 63) is converted into a corresponding AC drive signal applied to coil 42 (having a self-inductance of Ltx) via its associated capacitor Ctx. This produces electromagnetic signals 44 (magnetic fields), which are electromagnetically (magnetically) coupled into coil 48 in wireless power receiving device 54.

The degree of electromagnetic (magnetic) coupling between coils 42 and 48 is represented by magnetic coupling coefficient k. Signals 44 are received by coil 48 (having a self-inductance of Lrx). Coil 48 and capacitor Crx are coupled to rectifier 50. During operation, the AC signals from coil 48 that are produced in response to received signals 44 are rectified by rectifier 50 to produce direct-current output power (e.g., direct-current rectifier output voltage Vo) across output terminals 65. Terminals 65 may be coupled to the load of power receiving device 24 (e.g., battery 58 and other components in device 24 that are being powered by the direct-current power supplied from rectifier 50).

The inductance Ltx of each coil 42 is influenced by magnetic coupling with external objects, so measurements of inductance Ltx for one or more of coils 42 in device 12 at various frequencies can reveal information on objects on power transmitting device 12. To conserve power, device 12 may be operated in a standby mode while awaiting use to supply wireless power to devices 8. Signal measurement circuitry 41 may monitor for the presence of external objects during standby. To probe a selected coil for changes in inductance Ltx due to external objects, an alternating-current probe signal (e.g., a sine wave, square wave, etc.) at a probe frequency may be produced. The inductance Ltx may then be derived based on the known value of Ctx and the frequency of the impulse response signal. The value of quality factor Q may be derived from L and the measured decay of the impulse response signal. Coupling factor k may be determined based on the output voltage of rectifier 50 (Vo), transmit coil inductance Ltx, receive coil inductance Lrx, known capacitance Ctx, and other factors.

If the measured value of Ltx for a given coil matches the normal Ltx value expected for each of coils 42 in the array of coils 42, control circuitry 16 can conclude that no external object suitable for wireless charging is present. If a given measured value of Ltx is different (e.g., larger) from that expected for an unloaded coil, control circuitry 16 can conclude that an external object is present and can perform additional measurement operations.

FIGS. 1 and 2 only show one wireless power receiving device 24. However, power transmitting device 12 may transmit wireless power to any desired number of wireless power receiving devices 24 (e.g., two wireless power receiving devices, three wireless power receiving devices, more than three wireless power receiving devices, etc.).

Figure 3:
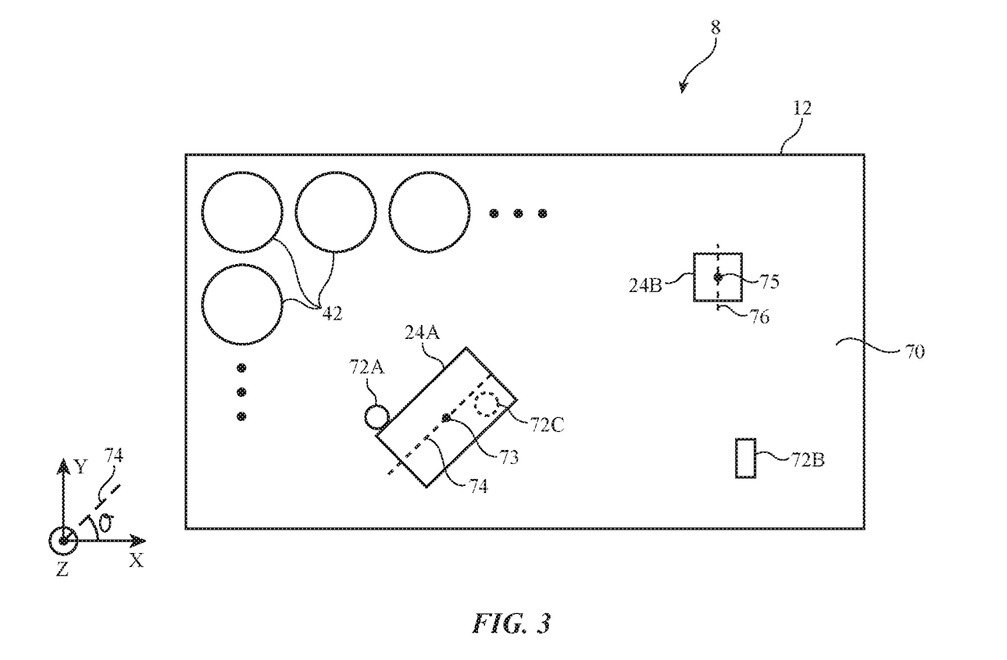
FIG. 3 is a top view of an illustrative wireless power transmitting device on which multiple wireless power receiving devices and multiple foreign objects have been placed in accordance with an embodiment.

A top view of an illustrative configuration for device 12 in which device 12 has an array of coils 42 is shown in FIG. 3. Device 12 may, in general, have any suitable number of coils 42 (e.g., 22 coils, at least 5 coils, at least 10 coils, at least 15 coils, fewer than 30 coils, fewer than 50 coils, etc.). Coils 42 of device 12 may be covered by a planar dielectric structure such as a plastic member or other structure forming charging surface 70. The lateral dimensions (X and Y dimensions) of the array of coils 42 in device 12 may be 1-1000 cm, 5-50 cm, more than 5 cm, more than 20 cm, less than 200 cm, less than 75 cm, or other suitable size. Coils 42 may overlap or may be arranged in a non-overlapping configuration. In a non-overlapping configuration, the coils may be arranged in a single layer (e.g., in a plane parallel to the XY-plane) such that no part of any coil overlaps any of the other coils in the layer. Alternatively, in an overlapping arrangement, coils 42 may be organized in multiple layers. Within each layer, the coils do not overlap. However, coils in one layer may overlap coils in one or more other layers (e.g., when viewed from above the outline of a given coil in a given layer may intersect the outline of a coil in another layer). In one illustrative example, the device may have three layers of coils (e.g., a lower layer having eight coils, a middle layer having seven coils, and an upper layer having seven coils). In general, each layer may have any suitable number of coils (e.g., at least 2 coils, at least 5 coils, fewer than 9 coils, fewer than 14 coils, 6-9 coils, etc.). Device 12 may have one layer of coils, at least two layers of coils, at least three layers of coils, at least four layers of coils, fewer than five layers of coils, 4-6 layers of coils, etc. Coils 42 can be placed in a rectangular array having rows and columns and/or may be tiled using a hexagonal tile pattern or other pattern.

A user of system 8 may sometimes place one or more wireless power receiving devices on device 12. For example, a user may place power receiving devices 24A and 24B (and, if desired, one or more additional devices) on device 12. Foreign objects 72A, 72B, and 72C such as coins, keys, paper clips, scraps of metal foil, and/or other foreign metallic objects may also be present on surface 70. Foreign object 72C may be positioned underneath wireless power receiving device 24A. If coils 42 are used to transmit wireless power signals while foreign objects such as foreign objects 72A, 72B and 72C are present, eddy currents may be induced in the foreign objects. These eddy currents have the potential to undesirably heat the foreign objects. The foreign objects may include sensitive electronic equipment that could be potentially damaged upon exposure to fields from coils 42.

To avoid undesired heating of foreign objects, system 8 automatically detects whether conductive objects located on surface 70 correspond to supported devices (e.g., supported power receiving devices such as devices 24A and 24B) or incompatible foreign objects (e.g., metallic objects without wireless power receiving coils such as objects 72A, 72B and 72C) and takes suitable action. When an object is detected on charging surface 70 (i.e., by measuring inductance values of the coils), system 8 may attempt to determine if the object is a supported power receiving device using in-band communication. Sufficient power may be provided using coils 42 to enable in-band communication. If in-band communication is not established or it is determined that the object is not a compatible power receiving device, the coils will not begin wireless charging. If, however, one or more compatible wireless power receiving devices 24 are detected, it may be desirable to transfer wireless power to power receiving devices 24 using power transmitting device 12.

Even if a compatible wireless power receiving device is detected, power transmitting device 12 may not begin to transmit wireless power until determining that no foreign objects are present on the power transmitting device. If a foreign object is present on charging surface 70, wireless power transfer may be prevented (even though it is otherwise desirable to transmit wireless power to compatible device(s) 24). Steps may therefore be taken by system 8 to determine if a foreign object is present before beginning wireless charging. For example, system 8 may perform image-processing-based foreign object detection (sometimes referred to as far-field foreign object detection) to detect foreign objects that are not adjacent to or under wireless power receiving devices and may perform machine-learning-based foreign object detection (sometimes referred to as near-field foreign object detection) to detect foreign objects that are adjacent to or under wireless power receiving devices.

In image-processing based foreign object detection, measurements such as inductance L, quality factor Q, and coupling factor k from each coil in the array may be examined. In-band communication may be used for wireless power transmitting device 12 to receive a device-identifier (RX-ID) from each wireless power receiving device on the charging surface. Each wireless power receiving device may have a characteristic pattern of measurements (e.g., inductance, quality factors and/or coupling factors) when the device is present on the charging surface. For example, device 24A may have a different characteristic pattern of measurements than device 24B. Upon receiving a device identifier, the wireless power transmitting device 12 may compare the known characteristic pattern of inductance measurements of the wireless power receiving device to the present inductance measurements from the coils 42. If inductance measurements (i.e., inductance measurements corresponding to foreign object 72A, 72B, and/or 72C) are present that do not correspond to a characteristic pattern from one of the known wireless power receiving devices present, it may be interpreted that a foreign object is present on the charging surface.

Machine-learning-based foreign object detection (sometimes referred to as near-field foreign object detection) may be used to detect foreign objects that are in close proximity to wireless power receiving devices on the charging surface. Machine-learning-based foreign object detection may include using a machine learning classifier to determine a probability value indicative of whether a foreign object is present on the charging surface. The probability value may be determined using inductance measurements, quality factors, coupling factors, and/or other desired measurements from coils 42. Machine-learning-based foreign object detection may be used to detect foreign objects such as foreign objects 72A and 72C that are in close proximity to a wireless power receiving device on the charging surface.

Each device 24 present on wireless power transmitting device 12 may have an associated location (e.g., position, angle, height, pitch, yaw, etc.). Take the example of wireless power receiving device 24A. Position may be considered the location of the center of mass (or another desired reference point) of the power receiving device in the XY-plane (e.g., on the surface area of power transmitting device 12). For example, the position may be defined relative to the center of the power transmitting device or a corner of the power transmitting device. Device 24A has a center of mass 73 with a position relative to the lower-left corner of the power transmitting device (e.g., center of mass 73 is located 10 inches in the X-direction, 4 inches in the Y-direction from the lower-left corner). Similarly, device 24B has a center of mass 75 with a position relative to the lower-left corner of the power transmitting device (e.g., center of mass 75 is located 20 inches in the X-direction, 8 inches in the Y-direction from the lower-left corner).

Each power receiving device may be characterized by a longitudinal axis. For example, device 24A in the example of FIG. 3 is characterized by longitudinal axis 74 whereas device 24B is characterized by longitudinal axis 76. The angle of a power receiving device on power transmitting device 12 may be considered the angle of the longitudinal axis of the device relative to the X-axis (or another desired reference vector). As shown in FIG. 3, longitudinal axis 74 of power receiving device 24A may be at an angle θ (e.g., 0°-360°) relative to the X-axis.

Each power receiving device may also have a characteristic height relative to charging surface 70 of power transmitting device 12. The height may be considered the separation between the charging surface (e.g., the upper surface of power transmitting device 12) and the surface of the power receiving device closest to the charging surface (or the distance between the charging surface and any other desired reference surface, reference plane, reference point, etc.). When a power receiving device is placed on charging surface 70 without intervening structures, the height may be 0. However, power receiving devices may have cases, wrist-watch bands, or other structures interposed between charging surface 70 and a lower surface of the power receiving device during charging. In these situations, the height may be greater than 0 (e.g., 1 millimeter, 2 millimeters, between 0.5 and 3 millimeters, between 0.5 and 10 millimeters, greater than 0.1 millimeters, less than 100 millimeters, etc.).

Therefore, each wireless power receiving device 24 on wireless power transmitting device 12 may have a location that is defined at least by the position, angle, and height of the wireless power receiving device. These characteristics (position, angle, height, etc.) are independent from each other (e.g., the power receiving device may have any angle or height at a given position).

To identify foreign objects, it may be desirable to gather data on the expected response of coils 42 in the presence of a wireless power receiving device. Measurements such as inductance (L), quality factor (Q), and coupling factor (k) may be taken from each coil in wireless power transmitting device 12 when a given wireless power receiving device is at different positions, angles, and heights. These measurements may populate a database of expected measurements (sometimes referred to as maps) for a given wireless power receiving device. Each supported wireless power receiving device may have a corresponding database of maps (e.g., a first type of cellular telephone may have a first database, a second type of cellular telephone may have a second data base, a watch may have a third database, etc.). If desired, an automated system may be used to generate coil data that is used to populate the database for each device. An automated system of this type is shown in FIG. 4.

Figure 4:
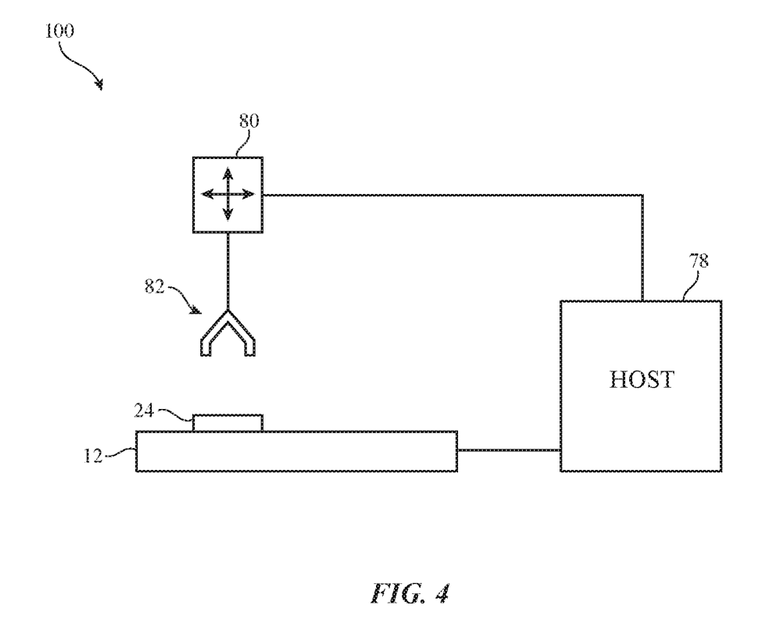
FIG. 4 is a schematic diagram of a system for gathering coil measurements in accordance with an embodiment.

FIG. 4 shows an illustrative system 100 for generating wireless power transmitting device coil data. System 100 (sometimes referred to as an automated system) may include a system of automated structures that may be used to facilitate generating data that characterizes the response of coils in power transmitting device 12 in the presence of wireless power receiving devices 24. The system of automated structures may include automated loading equipment, actuating members, positioning equipment, computer-controlled structures, etc. The system of automated structures may increase accuracy and speed of generating the desired data. The system of automated structures may include, for example, automated positioning equipment such as positioner 80. As shown in FIG. 4, positioner 80 may be used to accurately and precisely place wireless power receiving device 24 on wireless power transmitting device 12 at a desired position and angle. Positioner 80 may include one or more positioning arms 82 that may be used to pick up, move, and/or rotate wireless power receiving device 24 relative to the charging surface of device 12. Positioner 80 may also place wireless power receiving device 24 at different heights relative to the charging surface of device 12 (e.g., to mimic the effect of electronic device cases, watch bands, etc.). The positioning arms on positioner 80 may be actuated by one or more actuating members on positioner 80. The actuating members on positioner 80 may be actuated automatically (e.g., using automated equipment).

Positioner 80 may be controlled by host 78. Host 78 may include computing equipment such as a personal computer, laptop computer, tablet computer, or handheld computing device. Host 78 may include one or more networked computers. Host 78 may maintain a database of results, may be used in sending commands to positioner 80, may receive data from wireless power transmitting device 12 and/or wireless power receiving device 24, etc. If desired one or more components of system 100 may be included in an enclosure (e.g., a shielded test box) that can be used to provide isolation from the outside environment during testing.

To generate the data characterizing the response of coils in power transmitting device 12 in the presence of wireless power receiving devices 24, measurements (e.g., L, Q, k) may be taken from the array of coils in wireless power transmitting device 12 in a variety of scenarios. For example, host 78 may move wireless power receiving device 24 to a number of positions, angles, and heights on transmitting device 12 (without a foreign object present). At each location, measurements (e.g., L, Q, k) from all of the coils in device 12 may be stored by host 78. The host may associate the measurements from the coils with the corresponding position, angle, and height of the wireless power receiving device.

To summarize, host 78 may perform a number of trials. In each trial, one or more wireless power receiving devices 24 may be present on wireless power transmitting device 12 (with each device 24 having any desired position, angle, height, yaw, and pitch relative to wireless power transmitting device 12). In each trial, no foreign objects may be present on the charging surface of device 12. In each trial, data such as inductance measurements, quality factors, and coupling factors from the coils may be sent to host 78 from device 12. Host 78 may then associate the data from the coils with the location (e.g., position, angle, height, yaw, and pitch) of the wireless power receiving device. A number of trials (i.e., more than 100 trials, more than 1,000 trials, more than 10,000 trials, more than 100,000 trials, less than 100,000 trials, etc.) may be performed for each supported wireless power receiving device. The trials for a particular wireless power receiving device may populate a database of coil measurements (e.g., maps) associated with different positions, angles, and heights of the particular wireless power receiving device on the power transmitting device. Thus, a database of coil measurements and corresponding power receiving device locations may be generated for each supported power receiving device.

During operation of the wireless power transmitting device, the databases of coil measurements may be used to identify a location (e.g., position, angle, height) of a wireless power receiving device on the charging surface of the power transmitting device. For example, control circuitry in the wireless power transmitting device may receive a device-identifier indicating what type of supported power receiving device is present on the power transmitting device. The control circuitry may then identify the database associated with the present power receiving device. The control circuitry may then compare real-time coil measurements from the coils to the database to determine the location of the power receiving device that produces coil measurements that match the real-time coil measurements. The location in the database with corresponding coil measurements that match the real-time coil measurements may be determined to be the location (e.g., position, angle, height) of the wireless power receiving device. The databases may also be used to help determine if a foreign object is present on the wireless power transmitting device (e.g., if the real-time coil measurements do not have a close match in the database of coil measurements, a foreign object may be present).

Using measurements from the coil array of the wireless power transmitting device to determine the location of a wireless power receiving device and/or to determine whether or not a foreign object is present on the wireless power transmitting device may be challenging when multiple wireless power receiving devices are present on the wireless power transmitting device. Multiple wireless power receiving devices on the charging surface of the wireless power transmitting may interact with each other (in addition to the coils). In addition, the databases of coil measurements corresponding to different locations of wireless power receiving devices may be based on one wireless power receiving device being present. Due to a second wireless power receiving device affecting the coil measurements, the real-time coil measurements may not match the coil measurements associated with a given power receiving device at a given location in the database, even though the given power receiving device is in fact at the given location.

In one possible situation, a single wireless power receiving device may be present on wireless power transmitting device 12. No foreign objects may be present, and wireless power transmitting device 12 may transmit wireless power to the wireless power receiving device. Then, a second wireless power receiving device may be placed on wireless power transmitting device 12. It may be desirable to determine whether a foreign object is also present on the wireless power transmitting device. If the first wireless power receiving device does not move (e.g., the position, angle, and height remain the same) when the second device is placed on the wireless power transmitting device, then the difference in coil measurements from before the second device is placed on the power transmitting device and coil measurements from after the second device is placed on the power transmitting device may be examined during foreign object detection. This type of process is shown in FIG. 5.

Figure 5:
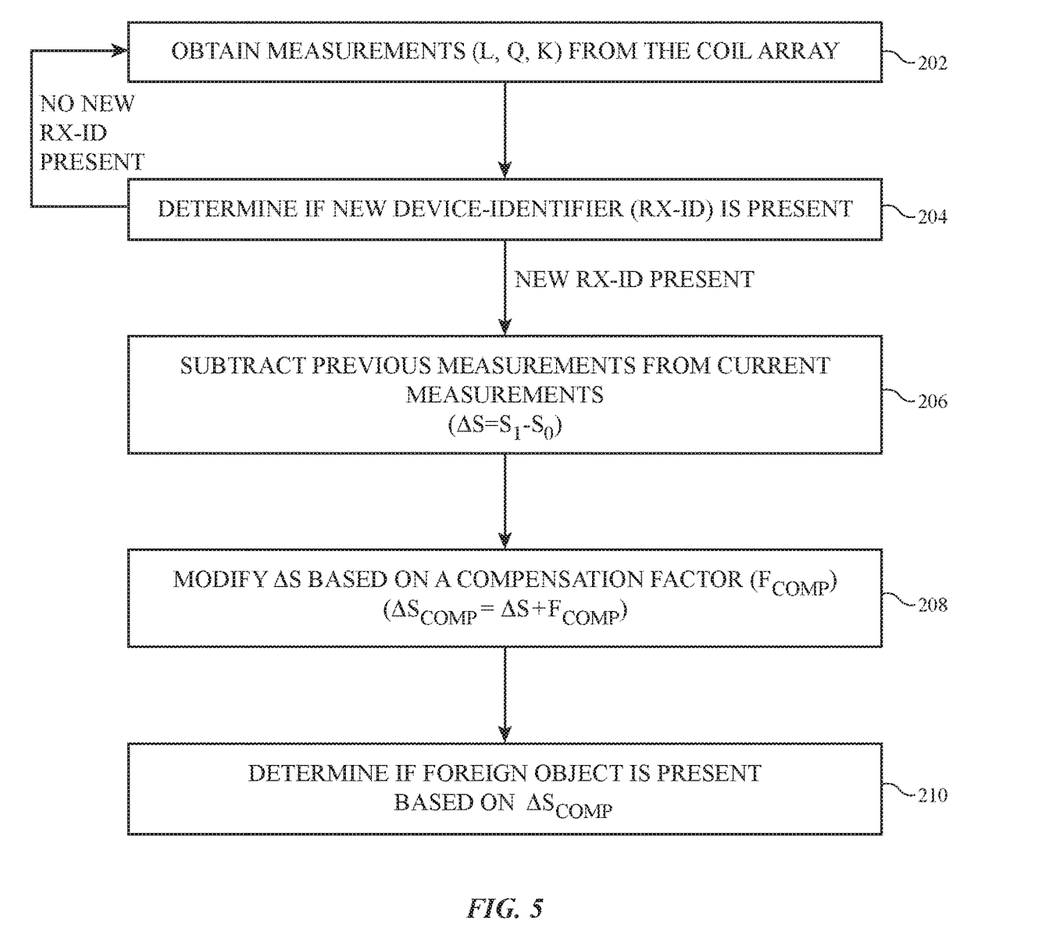
FIG. 5 is a flow chart of illustrative operations involved in operating a wireless power transmitting device when a wireless power receiving device is present on the wireless power transmitting device and an additional wireless power receiving device is added to the wireless power transmitting device in accordance with an embodiment.

FIG. 5 is a flow chart of illustrative operations involved in operating wireless power transmitting device 12 when one or more wireless power receiving devices are already present on the power transmitting device. As shown, during the operations of block 202, measurements such as inductance (L), quality factor (Q), and coupling factor (k) may be obtained. A set (S) of measurements may be obtained (e.g., $S_1$ includes L, Q, and k for each coil in the coil array at a given time $t_1$). These measurements may be taken at predetermined intervals (e.g., every T seconds). The measurements may be taken every 0.5 seconds, as an example. After each measurement, it may be determined whether or not an additional wireless power receiving device is present on the power transmitting device. This may be determined during the operations of block 204 by determining if a new device-identifier is present. For example, control circuitry in the wireless power transmitting device may receive a device-identifier from each supported power receiving device on the power transmitting device indicating what type of supported power receiving device is present. If a new device-identifier is received, control circuitry in the wireless power transmitting device may proceed to the operations of block 206. If no new device-identifier is received, control circuitry in the wireless power transmitting device may loop back to the operations of block 202 and take a new set of measurements (after the predetermined time interval T has passed).

In the operations of block 206, the measurements $S_1$ obtained at $t_1$ may be subtracted from measurements $S_0$ taken at $t_0$ before the new device-identifier was present (e.g., $\Delta S = S_1 - S_0$). For example, the inductances of each coil at $t_0$ may be subtracted from the inductances of that coil at $t_1$, the quality factor of each coil at $t_0$ may be subtracted from the quality factor of that coil at $t_1$, etc. The change in the measurements may be the result of the new wireless power receiving device being added to the power transmitting device.

If desired, $\Delta S$ may be modified based on a compensation factor during the operations of block 208. The compensation factor ($F_{comp}$) may be used to compensate for interaction between two wireless power receiving devices on the wireless power transmitting device (e.g., $\Delta S_{comp} = \Delta S + F_{comp}$).

For example, a cellular telephone is at a first location (i.e., position, angle, and height) on the wireless power transmitting device. A watch is at a second location (e.g., position, angle, and height) on the wireless power transmitting device. A quality factor $Q_C$ (e.g., 25) may be associated with a given coil in the coil array when the cellular telephone is in the first location. $Q_C$ may be found in the database of coil measurements associated with locations of the cellular telephone. Quality factor $Q_W$ (e.g., 5) may be associated with the given coil when the watch is in the second location. $Q_W$ may be found in the database of coil measurements associated with locations of the watch. If there were no interactions between the cellular telephone and the watch, the quality factor of the given coil when the cellular telephone is at the first location and the watch is at the second location may be the sum of $Q_C$ and $Q_W$ (e.g., 30). However, interactions between the cellular telephone and the watch may cause the actual coupling factor to be different (e.g., 32 instead of 30).

Now, continuing the example above, consider a scenario in which the cellular telephone is at the first location on the wireless power transmitting device (e.g., at $t_0$). The watch is then added to the wireless power transmitting device at the second location at $t_1$ (while the cellular telephone remains at the first location). The quality factor of the given coil may be 25 before the watch is added (e.g., $Q_0$ (part of $S_0$) of the given coil at $t_0$ is equal to 25). Then the watch is added to the wireless power transmitting device at the second location. The quality factor of the given coil may be 32 after the watch is added (e.g., $Q_1$ (part of $S_1$) of the given coil at $t_1$ is equal to 32). Subtracting $S_0$ from $S_1$ to determine the contribution of the watch may result in a $\Delta Q$ value (e.g., $\Delta Q = Q_1 - Q_0$). In this example, $\Delta Q$ is equal to 7. However, the quality factor contribution of the watch to the given coil (without interaction with the cellular telephone) is actually 5. The compensation factor ($F_{comp}$) may therefore be equal to −2 in this example. When $\Delta Q$ is modified by (e.g., added to) the compensation factor, the result ($\Delta Q_{comp}$) is 5 (which is the expected quality factor of the given coil with only the watch present at the second location).

The compensation factor may be determined during the operations of block 208 as a function of the change in the measurements of the coil array ($\Delta S$) and the first measurements from the coil array ($S_0$).

The function for determining the compensation factor may be determined based on known data regarding the interaction between different wireless power receiving devices. For example, using system 100 in FIG. 4, a number of trials may be performed. During each trial, first coil measurements from the coil array may be taken with a first wireless power receiving device at a first location. Next, a second wireless power receiving device may be added to a second location and second coil measurements from the coil array may be taken (with the first wireless power receiving device remaining in the first location). Finally, the first wireless power receiving device may be removed from the charging surface and third measurements from the coil array may be taken (with only the second wireless power receiving device at the second location present). The first, second, and third measurements of each trial, as well as the types of devices used as the first and second wireless power receiving devices, may be used to develop a function for determining the compensation factor ($F_{comp}$).

During the operations of block 210, the compensated difference in measurements ($\Delta S_{comp}$) may be used to determine if a foreign object is present. The compensated difference in measurements ($\Delta S_{comp}$) represents the measurements that are associated with the presence of the new wireless power receiving device (because $\Delta S_{comp}$ removes portions of the measurements associated with the originally present wireless power receiving device and interactions between the two wireless power receiving devices). Therefore, foreign object detection (e.g., image-processing-based foreign object detection, machine-learning-based foreign object detection, etc.) may be performed on $\Delta S_{comp}$ (as if just one device was present).

The operations of FIG. 5 may be useful in detecting foreign objects in situations where one or more power receiving devices are present on a power transmitting device when an additional power receiving device is added to the power transmitting device without moving the one or more power receiving devices already present. In these situations, the coil measurements from just before the new power receiving device was added may be subtracted from the new coil measurements (because the originally present devices have not moved). However, in some cases, subtracting measurements in this way may not be practical. For example, a power receiving device may be present on a power transmitting device when an additional power receiving device is added to the power transmitting device, moving the original power receiving device in the process. In this situation, the change in location of the original power receiving device means that the data from before the new wireless power receiving device cannot be used (because the measurements do not apply to the original power receiving device's new location).

Other scenarios may arise where multiple power receiving devices are present on a power transmitting device. For example, two power receiving devices may be placed on the power transmitting device simultaneously. In another example, two power receiving devices may be resting on the power transmitting device while the power transmitting device is turned off. When the power transmitting device is turned on, there are then two power transmitting devices to be assessed. In these scenarios, identifying the locations of the wireless power receiving devices on the wireless power transmitting device and/or detecting foreign objects may be challenging.

Figure 6:
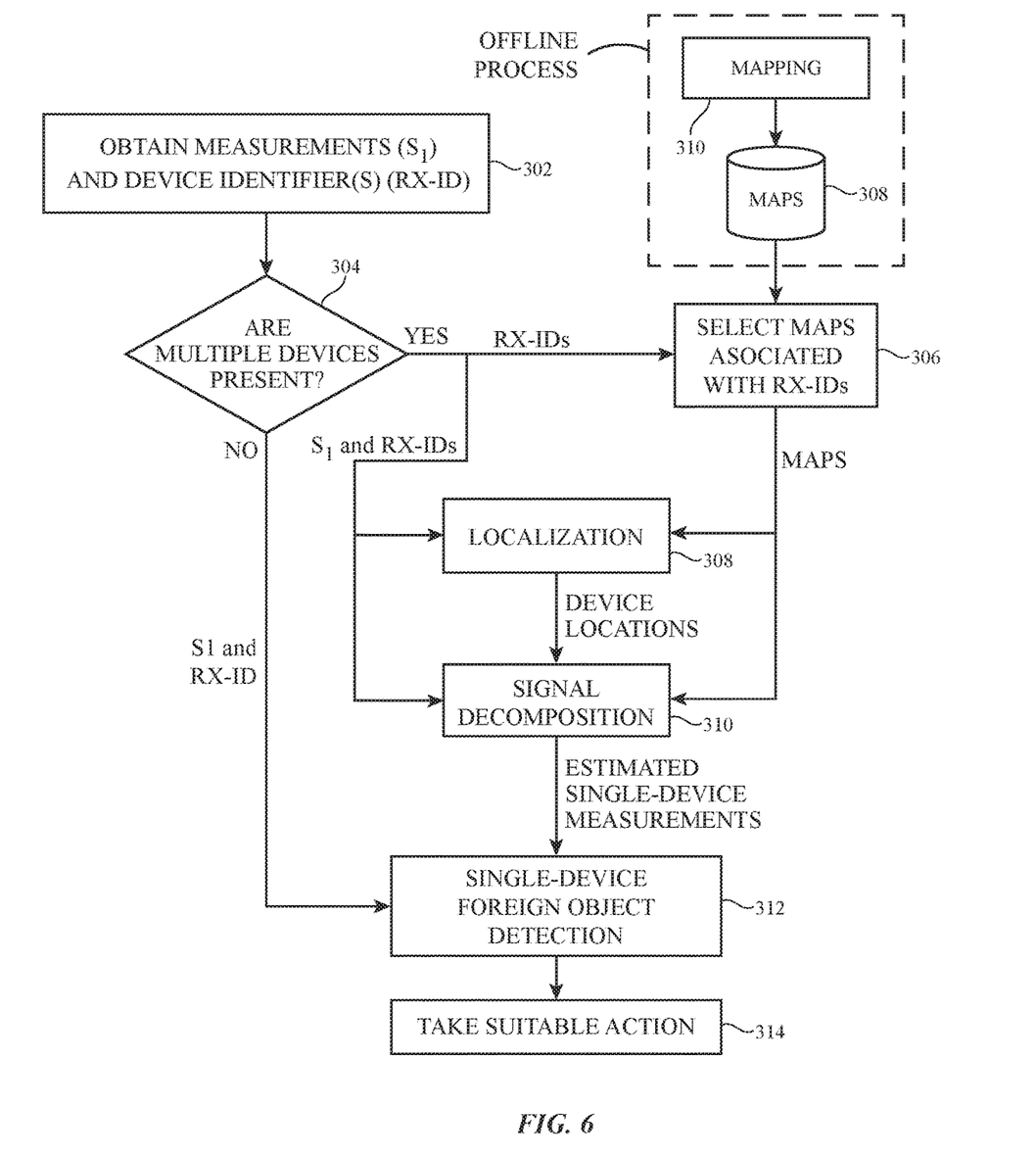
FIG. 6 is a flow chart of illustrative operations involved in operating a wireless power transmitting device when two or more wireless power receiving devices are present on the wireless power transmitting device in accordance with an embodiment.

FIG. 6 is a flow chart of illustrative operations involved in operating wireless power transmitting device 12. During the operations of block 302, wireless power transmitting device 12 may obtain coil measurements (e.g., L, Q, k, etc.) from each coil in the coil array. Additionally, during the operations of block 302 control circuitry in the wireless power transmitting device may receive a device-identifier (RX-ID) from each supported power receiving device on the power transmitting device. Each device-identifier may indicate what type of supported power receiving device is present. The device-identifiers may be communicated from the wireless power receiving devices to the wireless power transmitting device using in-band communication if desired. Wireless transceiver circuitry 46 (FIG. 1) of a wireless power receiving device 24 may transmit the device-identifier in-band to device 12 by using a switch (e.g., one or more transistors in transceiver 46 (FIG. 1) that are coupled coil 48) to modulate the impedance of power receiving circuitry 54 (e.g., coil 48). This, in turn, modulates the amplitude of signal 44 and the amplitude of the AC signal passing through coil(s) 42. Wireless transceiver circuitry 40 in power transmitting device 12 monitors the amplitude of the AC signal passing through coil(s) 42 and, using ASK demodulation, extracts the transmitted device-identifier from these signals that were transmitted by wireless transceiver circuitry 46.

During the operations of block 304, power transmitting device 12 may determine if multiple devices are present (e.g., were two or more RX-IDs received). If only one device is present, the set of measurements ($S_1$) and device-identifier (RX-ID) may be used for single-device foreign object detection during the operations of block 312. If two or more RX-IDs are present, the RX-IDs may be used to select maps associated with the RX-IDs during the operation of block 306.

During the operations of block 306, the power transmitting device may use maps from database 308 that are associated with the received device-identifier (RX-ID). Map database 308 may be formed during the mapping operations of block 310. During the operations of block 310, a system such as system 100 in FIG. 4 may be used to generate wireless power transmitting device coil data when various supported wireless power receiving devices are in different locations. As previously discussed, measurements (e.g., L, Q, k) may be taken from the array of coils in wireless power transmitting device 12 in each trial of a number of trials, and the measurements may be associated with a location of the power receiving device during the trial. The results of each trial may be considered a map (e.g., a map of coil measurements corresponding to a device location). Each supported wireless power receiving device may therefore have an associated database of maps. Because the maps are generated before the wireless power transmitting device is actually used (e.g., used by a consumer), the mapping process may be referred to as an offline process.

The maps obtained during block 306 may be provided to localization block 308. Localization block 308 may also use the measurements $S_1$ and RX-IDs as input. During the operations of block 308, the locations (e.g., positions, angles, heights) of the power receiving devices present on the power transmitting device may be determined. To determine the locations of the power receiving devices, the maps associated with the power receiving devices may be used.

As an example of localization, consider an example where a cellular telephone and watch are present on the wireless power transmitting device. The localization block therefore receives the real-time coil measurements $S_1$, the RX-IDs associated with the cellular telephone and watch, and the maps associated with the cellular telephone and watch. To find the locations of the cellular telephone and watch, the maps may be searched to find a combination of the maps that matches the real-time measurements $S_1$. For example, first, the coil measurements (e.g., $S_{C1}$) associated with the cellular telephone at a first location (which are obtained from the map of coil measurements associated with the cellular telephone at the first location) may be considered. These measurements may be combined (e.g., added) with coil measurements (e.g., $S_{W2}$) associated with the watch at a second location (which are obtained from the map of coil measurements associated with the watch at the second location) to obtain the result $S_{comb}$ (e.g., $S_{comb}=S_{C1}+S_{W2}$). If the combination is equal to the real-time measurements (e.g., if $S_1=S_{comb}$), the cellular telephone may be determined to be at the first location and the watch may be determined to be at the second location. If the combination is not equal to the real-time measurements, $S_{C1}$ may be combined with different coil measurements (e.g., $S_{W3}$) associated with the watch at a third location (which are obtained from the map of coil measurements associated with the watch at the third location) to obtain the result $S_{comb}$. The new $S_{comb}$ (e.g., $S_{comb}=S_{C1}+S_{W3}$) may then be compared to the real-time measurements $S_1$. If desired, this cycle (e.g., combining coil measurements of the cellular telephone at different locations and coil measurements of the watch at different locations) may be continued until all of the combination of maps for the cellular telephone and watch have been examined.

In the example above, it was stated that if the combination is equal to the real-time measurements (e.g., if $S_1=S_{comb}$), the cellular telephone may be determined to be at the first location and the watch may be determined to be at the second location. However, the example of $S_1$ and $S_{comb}$ being exactly equal is merely illustrative. In practice, if $S_{comb}$ is within a predetermined threshold of $S_1$, the two maps used to produce $S_{comb}$ may be considered a 'match' and the locations of the devices in the two maps may be considered to be the locations of the devices. Any desired type of threshold may be used (e.g., within 0.5%, within 1%, within 5%, within 10%, etc.). Additionally, $S_1$ and $S_{comb}$ actually contain information regarding a number of measurements (e.g., L, Q, k, etc.) for a number of coils. Different thresholds may be applied to each measurement in $S_1$ if desired (e.g., $L_{comb}$ for a given coil may have to be within 1% of $L_1$ for the given coil for a match whereas $Q_{comb}$ for the given coil may have to be within 5% of $Q_1$ for the given coil for a match) or the same threshold may be applied to all of the measurements in $S_1$ if desired.

If desired, $S_{comb}$ may be the result of adding the measurements associated with the two selected maps (e.g., $S_{comb}=S_{C1}+S_{W2}$ or $S_{comb}=S_{C1}+S_{W3}$ in the examples above). However, if desired an additional compensation factor may be included when determining $S_{comb}$. The compensation factor may be similar to the compensation factor described in connection with block 208 of FIG. 5. The compensation factor may help compensate for interactions between the two devices that affect the coil measurements. As discussed in connection with FIG. 5, the function for determining the compensation factor may be determined based on known data regarding the interaction between different wireless power receiving devices.

As shown in FIG. 6, the result of the operations of block 308 may be the location of the wireless power receiving devices on the wireless power transmitting device. These locations may be used during the operations of block 310. During the operations of block 310, signal decomposition may be performed to determine a predicted image of each device present if no other devices were present. Consider the example where a cellular telephone is at a first location and a watch is at a second location on the power transmitting device. It may be desirable to obtain predicted coil measurements (e.g., $S_1'$) that correspond to the coil measurements if only the cellular telephone in the first location was present. $S_1'$ may be obtained using the real-time measurements from the coil array ($S_1$) and the coil measurements from the map of the watch at the second location. For example, the coil measurements from the map of the watch at the second location (e.g., $S_{W2}$) may be subtracted from the real-time coil measurements $S_1$ to obtain $S_1'$. The compensation factor $F_{comp}$ discussed in connection with block 208 of FIG. 5 may also be used during the signal decomposition processing (e.g., $S_1'=S_1-S_{W2}+F_{comp}$). The compensation factor $F_{comp}$ may be obtained using the same methods as discussed in connection with block 208 of FIG. 5 (e.g., the compensation factor may be determined as a function of the difference between the real-time coil measurements and the coil measurements associated with the watch at the second location ($S_1-S_{W2}$) and the coil measurements $S_{W2}$ associated with the watch at the second location).

Just as predicted coil measurements ($S_1'$) that correspond to the coil measurements if only the cellular telephone in the first location was present may be obtained, predicted coil measurements ($S_1''$) that correspond to the coil measurements if only the watch in the second location was present may be obtained. $S_1''$ may be obtained using the real-time measurements from the coil array ($S_1$) and the coil measurements from the map of the cellular telephone at the first location. For example, the coil measurements from the map of the cellular telephone at the first location (e.g., $S_{C1}$) may be subtracted from the real-time coil measurements $S_1$ to obtain $S_1''$. The compensation factor $F_{comp}$ discussed in connection with block 208 of FIG. 5 may also be used during the signal decomposition processing (e.g., $S_1''=S_1-S_{C1}+F_{comp}$).

In the event that the first wireless power receiving device is present on the wireless power transmitting device then the second wireless power receiving device is added to the wireless power transmitting device (without moving the first wireless power receiving device), a signal decomposition process of the type described in connection with FIG. 5 (e.g., the operations of blocks 206 and 208 in FIG. 5) may be used. In other words, the measurements from before the second device is added may be subtracted from the measurements from after the second device is added to help obtain $S_1'$ and $S_1''$ if desired.

The predicted coil measurements $S_1'$ and $S_1''$ may sometimes be referred to as estimated single-device measurements. The estimated single-device measurements may be used to detect foreign objects during the operations of block 312. During the operations of block 312, each set of estimated single-device measurements may undergo a foreign object detection process. Foreign object detection (e.g., image-processing-based foreign object detection, machine-learning-based foreign object detection, etc.) may be performed on the estimated single-device measurements as if just one device was present. For example, the foreign object detection for the first wireless power receiving device may be based on the estimated single-device measurements $S_1'$ and the wireless power receiving device being a cellular telephone. The foreign object detection for the second wireless power receiving device may be based on the estimated single-device measurements $S_1''$ and the wireless power receiving device being a watch.

During the operations of block 314, control circuitry 16 of power transmitting device 12 may take suitable action in response to the findings of the foreign object detection. For example, if a foreign object is detected during the operations of block 312, control circuitry 16 may cause wireless power transmitting circuitry 52 (FIG. 1) to forgo transmitting wireless power signals with coils 42. If a foreign object is not detected during the operations of block 312, control circuitry 16 may cause wireless power transmitting circuitry 52 to transmit wireless power signals with coils 42. If machine-learning foreign object detection is performed in block 312, control circuitry 16 of power transmitting device 12 may compare the probability value (i.e., the probability of a foreign object being present) from the machine learning classifier to a predetermined threshold. If the probability value exceeds the threshold (indicating a foreign object is likely present), control circuitry 16 may cause wireless power transmitting circuitry 52 to forgo transmitting wireless power signals with coils 42. In contrast, if the probability value is less than the threshold (indicating a foreign object is likely not present), control circuitry 16 may cause wireless power transmitting circuitry 52 to transmit wireless power signals with one or more coils 42.

In certain embodiments where power transmitting device 12 includes more than one coil 42, only a subset of coils 42 may transfer wireless power signals. Different coils may transfer different amounts of wireless power if desired. Wireless power may be transmitted with any desired coil(s) at any desired level(s) based on the locations of the wireless power receiving devices determined in block 308. For example, the coils that are underneath the locations determined in block 308 may be used to transmit wireless power. In some embodiments, a foreign object may be detected but determined to be far enough away from a wireless power receiving device to enable wireless power transfer without heating the foreign object. In these embodiments, wireless power may be transferred to a wireless power receiving device (even though a foreign object is present on the charging surface)

In some embodiments, when a foreign object is determined to likely be present, control circuitry 16 may generate an alert that notifies a user that the foreign object is present. The alert may be, for example, a visual alert displayed on one or both of power receiving devices 24 on the power transmitting device 12 or an auditory alert emitted by one or both of power receiving devices 24. For example, power transmitting device 12 may convey the alert to one or both of power receiving devices 24 using in-band communication. One or both of power receiving devices 24 may then display a visual alert using a display, emit an auditory alert using a speaker, or convey a haptic alert using a haptic output device (e.g., a vibrator). The power receiving devices may convey the alert using any desired component (i.e., input-output devices 56 such as a display or audio components). Alternatively, power transmitting device 12 may include input-output components (i.e., a display or audio component) that are used to convey the alert to the user. In general, any desired action may be taken during operations of block 314.

The foregoing is merely illustrative and various modifications can be made to the described embodiments. The foregoing embodiments may be implemented individually or in any combination.

What is claimed is:

1. A wireless power transmitting device with a charging surface configured to receive first and second wireless power receiving devices simultaneously, the wireless power transmitting device comprising:
    a plurality of coils;
    wireless power transmitting circuitry coupled to the plurality of coils and configured to transmit wireless power signals with the plurality of coils; and
    control circuitry configured to:
        determine that the first wireless power receiving device and the second wireless power receiving device are coupled with the plurality of coils;
        gather measurements using the plurality of coils;
        modify the measurements to obtain first modified measurements that are associated with the first wireless power receiving device and that are compensated for interaction between the first and second wireless power receiving devices; and
        modify the measurements to obtain second modified measurements that are associated with the second wireless power receiving device and that are compensated for interaction between the first and second wireless power receiving devices.

2. The wireless power transmitting device of claim 1, wherein the measurements comprise one or more measurements selected from the group consisting of: inductance measurements, quality factor measurements, and coupling factor measurements.

3. The wireless power transmitting device of claim 1, wherein the control circuitry is configured to control transmission of wireless power using the wireless power transmitting circuitry based at least on the first modified measurements and the second modified measurements.

4. The wireless power transmitting device of claim 1, wherein the control circuitry is configured to:
    determine if a foreign object is present based on the first modified measurements; and
    after determining if a foreign object is present based on the first modified measurements, determine if a foreign object is present based on the second modified measurements.

5. The wireless power transmitting device of claim 1, wherein the control circuitry is configured to determine that the first wireless power receiving device and the second wireless power receiving device are coupled with the plurality of coils by wirelessly receiving a first device-identifier from the first wireless power receiving device and a second device-identifier from the second wireless power receiving device.

6. The wireless power transmitting device of claim 5, wherein the control circuitry is configured to:
    in response to wirelessly receiving the first device-identifier from the first wireless power receiving device and the second device-identifier from the second wireless power receiving device, obtain first predetermined sets of measurements associated with known locations of the first wireless power receiving device and second predetermined sets of measurements associated with known locations of the second wireless power receiving device.

7. The wireless power transmitting device of claim 6, wherein the control circuitry is configured to:
    combine one predetermined set of measurements associated with a known first location of the first wireless power receiving device with one predetermined set of measurements associated with a known second location of the second wireless power receiving device to form a measurement combination; and
    based on a comparison between the measurement combination and the measurements from the plurality of coils, determine that the first wireless power receiving device is at the first location and the second wireless power receiving device is at the second location.

8. The wireless power transmitting device of claim 7, wherein modifying the measurements to obtain first modified measurements that are associated with the first wireless power receiving device and that are compensated for interaction between the first and second wireless power receiving devices comprises:
    subtracting the one predetermined set of measurements associated with the known second location of the second wireless power receiving device from the measurements from the plurality of coils.

9. The wireless power transmitting device of claim 8, wherein modifying the measurements to obtain second modified measurements that are associated with the second wireless power receiving device and that are compensated for interaction between the first and second wireless power receiving devices comprises:

subtracting the one predetermined set of measurements associated with the known first location of the first wireless power receiving device from the measurements from the plurality of coils.

10. The wireless power transmitting device of claim 9, wherein modifying the measurements to obtain first modified measurements that are associated with the first wireless power receiving device and that are compensated for interaction between the first and second wireless power receiving devices further comprises:

adding a first compensation factor to a difference between the one predetermined set of measurements associated with the known second location of the second wireless power receiving device and the measurements from the plurality of coils, wherein the first compensation factor compensates for interaction between the first and second wireless power receiving devices.

11. The wireless power transmitting device of claim 10, wherein modifying the measurements to obtain second modified measurements that are associated with the second wireless power receiving device and that are compensated for interaction between the first and second wireless power receiving devices further comprises:

adding a second compensation factor to a difference between the one predetermined set of measurements associated with the known first location of the first wireless power receiving device and the measurements from the plurality of coils, wherein the second compensation factor compensates for interaction between the first and second wireless power receiving devices.

12. A wireless power transmitting device with a charging surface configured to receive first and second wireless power receiving devices simultaneously, the wireless power transmitting device comprising:

a plurality of coils;
  wireless power transmitting circuitry coupled to the plurality of coils and configured to transmit wireless power signals with the plurality of coils; and
  control circuitry configured to:
    gather first measurements using the plurality of coils;
    after gathering the first measurements, determine that the first wireless power receiving device is coupled with the plurality of coils;
    gather second measurements using the plurality of coils;
    after gathering the second measurements, determine that the first and second wireless power receiving devices are coupled with the plurality of coils;
    determine a difference between the first measurements and the second measurements;
    modify the difference between the first measurements and the second measurements using a compensation factor; and
    control transmission of wireless power using the wireless power transmitting circuitry based at least on the modified difference between the first measurements and the second measurements.

13. The wireless power transmitting device of claim 12, wherein the compensation factor compensates the difference between the first measurements and the second measurements for interaction between the first wireless power receiving device and the second wireless power receiving device.

14. The wireless power transmitting device of claim 12, wherein the first measurements comprise one or more measurements selected from the group consisting of: inductance measurements, quality factor measurements, and coupling factor measurements and wherein the second measurements comprise one or more measurements selected from the group consisting of: inductance measurements, quality factor measurements, and coupling factor measurements.

15. The wireless power transmitting device of claim 12, wherein the control circuitry is configured to:

determine if a foreign object is present based on the modified difference between the first measurements and the second measurements.

16. The wireless power transmitting device of claim 15, wherein controlling transmission of wireless power using the wireless power transmitting circuitry based at least on the modified difference between the first measurements and the second measurements comprises:

in accordance with determining that the foreign object is present, causing the wireless power transmitting circuitry to transmit wireless power signals with one or more coils of the plurality of coils.

17. The wireless power transmitting device of claim 15, wherein controlling transmission of wireless power using the wireless power transmitting circuitry based at least on the modified difference between the first measurements and the second measurements comprises:

in accordance with determining that the foreign object is not present, causing the wireless power transmitting circuitry to forgo transmitting wireless power signals with one or more coils of the plurality of coils.

18. A wireless power transmitting device with a charging surface configured to receive first and second wireless power receiving devices simultaneously, the wireless power transmitting device comprising:

a plurality of coils;
  wireless power transmitting circuitry coupled to the plurality of coils and configured to transmit wireless power signals with the plurality of coils; and
  control circuitry configured to:
    determine that the first wireless power receiving device and the second wireless power receiving device are coupled with the plurality of coils;
    gather measurements using the plurality of coils;
    combine predetermined sets of measurements associated with known locations of the first wireless power receiving device with predetermined sets of measurements associated with known locations of the second wireless power receiving device to form measurement combinations; and
    compare the measurement combinations to the measurements from the plurality of coils to determine a location of the first wireless power receiving device and a location of the second wireless power receiving device.

19. The wireless power transmitting device of claim 18, wherein the measurements comprise one or more measurements selected from the group consisting of: inductance measurements, quality factor measurements, and coupling factor measurements.

20. The wireless power transmitting device of claim 18, wherein the control circuitry is configured to control transmission of wireless power based on the location of the first wireless power receiving device and the location of the second wireless power receiving device.

* * * * *